United States Patent [19]

Murakata

[11] Patent Number: 4,839,821

[45] Date of Patent: Jun. 13, 1989

[54] AUTOMATIC CELL-LAYOUT ARRANGING METHOD AND APPARATUS FOR POLYCELL LOGIC LSI

[75] Inventor: Masami Murakata, Kawasaki, Japan

[73] Assignee: Kabushiki Kaisha Toshiba, Kawasaki, Japan

[21] Appl. No.: 945,854

[22] Filed: Dec. 23, 1986

[30] Foreign Application Priority Data

Feb. 25, 1986 [JP] Japan .................................. 61-39527

[51] Int. Cl.$^4$ ............................................. G06F 15/60
[52] U.S. Cl. .................................. 364/491; 364/300; 364/488; 364/490
[58] Field of Search ............... 364/300, 488, 489, 490, 364/491

[56] References Cited

U.S. PATENT DOCUMENTS

| | | | |
|---|---|---|---|
| 3,653,072 | 3/1972 | Ballas et al. ..................... | 364/491 X |
| 3,681,782 | 8/1972 | Scanlon ............................ | 364/491 X |
| 4,577,276 | 3/1986 | Dunlop et al. ..................... | 364/491 |
| 4,580,228 | 4/1986 | Noto .................................. | 364/491 |
| 4,593,363 | 6/1986 | Burstein et al. ................ | 364/300 X |
| 4,613,941 | 9/1986 | Smith et al. ...................... | 364/490 |
| 4,630,219 | 12/1986 | DiGiacomo et al. ........... | 364/491 X |

FOREIGN PATENT DOCUMENTS 59-132144 7/1984 Japan .

OTHER PUBLICATIONS

Proceedings of Iscas, "A Global Routing Scheme For Polycell LSI" T. Kambe et al., 1985.

Primary Examiner—Parshotam S. Lall
Assistant Examiner—Edward R. Cosimano
Attorney, Agent, or Firm—Oblon, Fisher, Spivak, McClelland & Maier

[57] ABSTRACT

In an automatic cell-layout arranging system for a polycell logic LSI, polycells are initially arranged in the form of cell arrays on a chip substrate. Connection paths for wiring lines among the polycells are then determined in accordance with cell-wiring requirements, so as to maximally satisfy a predetermined object function, thereby obtaining an LSI logic circuit capable of performing the desired function. A processor unit calculates a first number "N" of wiring lines actually extending through each of the cell arrays, and a second number "ml" representing an allowable number of through-lines for each cell array. Thereafter, this unit calculates a third number "K" representing the difference "ml−N" between the first and second numbers. When a certain cell array where the third number "K" is less than zero is included in the cell arrays, the standard cells are rearranged on the chip substrate such that the third number "K" is increased to zero or more than zero, thereby maximally eliminating the need to use through-cells for passing wiring lines through the cell arrays.

6 Claims, 5 Drawing Sheets

F I G. 1
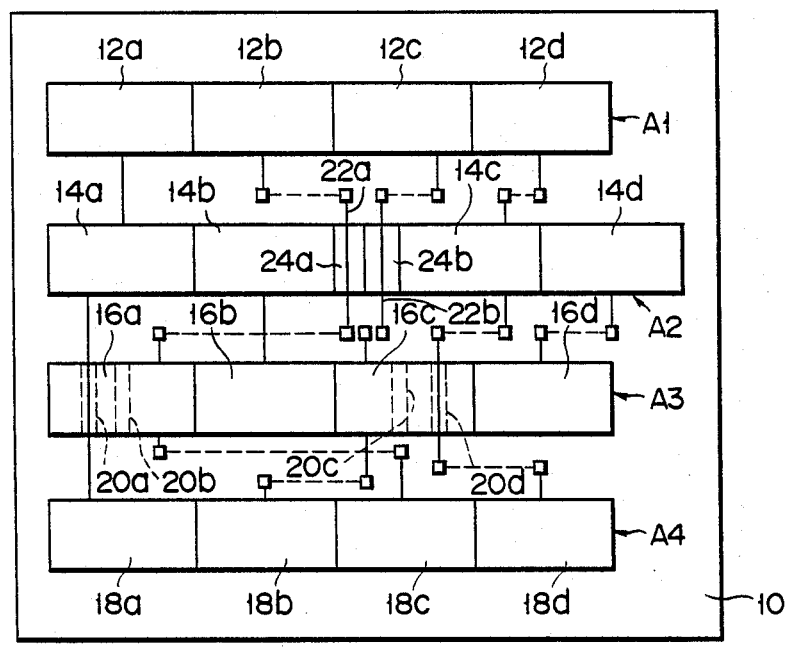
F I G. 5
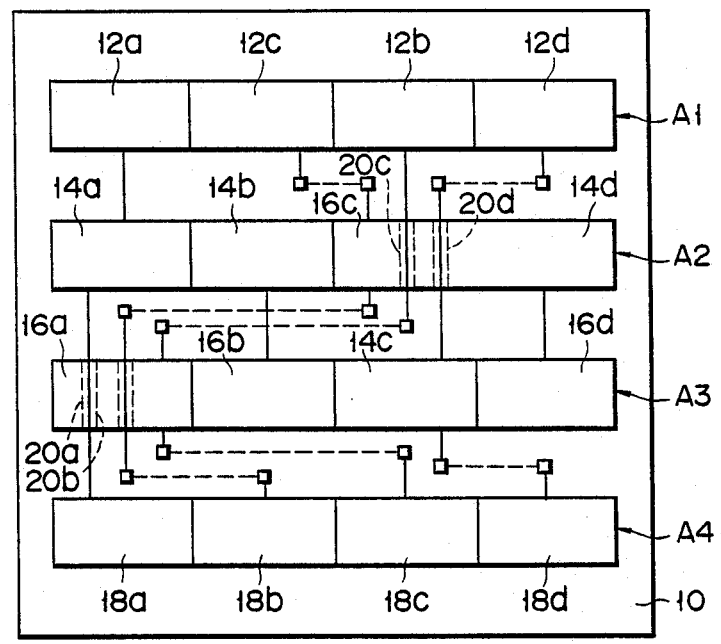

FIG. 3A

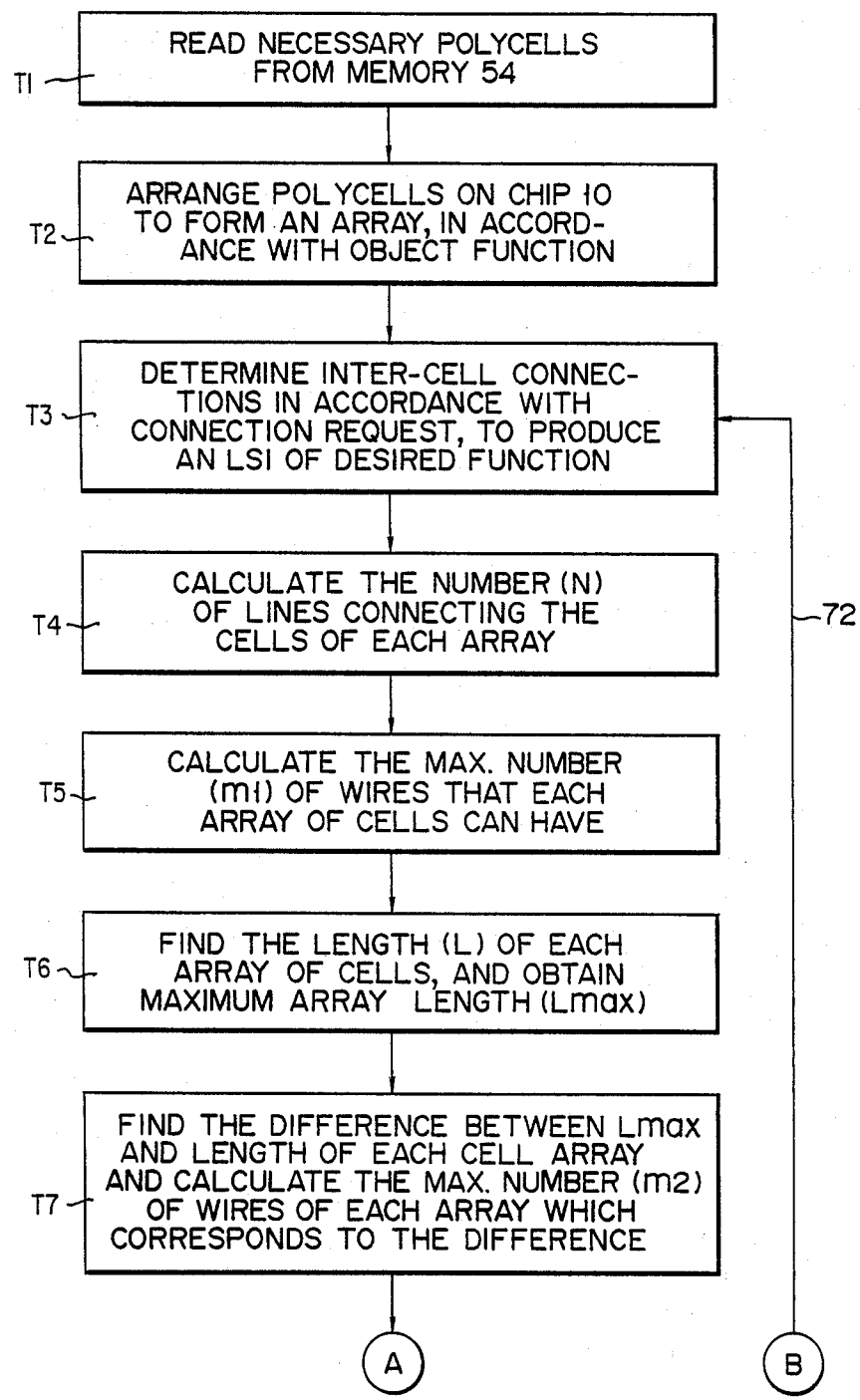

T1 — READ NECESSARY POLYCELLS FROM MEMORY 54

T2 — ARRANGE POLYCELLS ON CHIP 10 TO FORM AN ARRAY, IN ACCORDANCE WITH OBJECT FUNCTION

T3 — DETERMINE INTER-CELL CONNECTIONS IN ACCORDANCE WITH CONNECTION REQUEST, TO PRODUCE AN LSI OF DESIRED FUNCTION

T4 — CALCULATE THE NUMBER (N) OF LINES CONNECTING THE CELLS OF EACH ARRAY

T5 — CALCULATE THE MAX. NUMBER (m1) OF WIRES THAT EACH ARRAY OF CELLS CAN HAVE

T6 — FIND THE LENGTH (L) OF EACH ARRAY OF CELLS, AND OBTAIN MAXIMUM ARRAY LENGTH (Lmax)

T7 — FIND THE DIFFERENCE BETWEEN Lmax AND LENGTH OF EACH CELL ARRAY AND CALCULATE THE MAX. NUMBER (m2) OF WIRES OF EACH ARRAY WHICH CORRESPONDS TO THE DIFFERENCE (A)    (B)    —72

AUTOMATIC CELL-LAYOUT ARRANGING METHOD AND APPARATUS FOR POLYCELL LOGIC LSI

BACKGROUND OF THE INVENTION

The present invention relates to semiconductor logic LSI devices and, more particularly, to a system for designing a cell-layout of a polycell LSI having arrays of high-speed logic components for performing arithmetic and logical operations on data to be processed by a computer.

Recently, great efforts have been made to develop logic LSIs which offer the best possible performance vis-a-vis executing desired arithmetic logic functions. An important aspect of the logic LSI designer's job is the constant search for the best possible trade-off between cost and performance.

To provide a logic LSI capable of performing of the desired logic function, two basically different approaches exist. The first approach is to make a custom-made LSI, in which an optimum logic circuit having an exclusive hierarchical layout of logic elements, which conforms to a desired design specification, is fabricated on a chip substrate, by a known micro-patterning technique. Such a custom-made LSI can be effectively designed, to meet all the user's requirements of a desired logic function. This custom-made LSI, however, suffers from drawbacks, in that its design time is long, the manufacturing cost is high, and functional flexibility is extremely limited, thereby involving high risk on the part of a user.

The second approach is to produce a "gate-array LSI" (also known as a "master-slice LSI"), a "standard cell LSI" (also known as a "polycell LSI"), or the like. Such a semi-customized LSI can be manufactured in a short time and at a low cost, since a common chip substrate having cell arrays can be used to provide various types of logic LSIs of different functions. The function of each chip can be altered merely by adding a different wiring pattern to the chip. Hence, the semicustom LSI has considerable functional flexibility.

In particular, polycell LSIs have a wide functional flexibility and also a high integration density. Year by years, they are attracting more and more of the attention of semiconductor manufacturers. Unlike a gate-array LSI, a polycell LSI requires no mask patterns to form standard cell arrays. Further, the size of its wiring region, known as a "channel," located between the cell arrays on the chip, is not limited. This offers increased flexibility regarding the wiring pattern design.

In the polycell LSI, polycells, such as inverters, 3-input NOR gates, and flip-flops, are arrayed on the chip substrate. To customize the chip, a wiring pattern is used which has been designed so as to form an arithmetic logic circuit performing the specific function desired by the user.

In the conventional method of designing the wiring pattern for a polycell LSI, it is very important for the designers to arrange polycells on a chip substrate, such that (i) the chip substrate can be as small as possible and (ii) the selected standard cells can be effectively connected by way of the shortest possible lines. However, designers often find it necessary to use some wiring lines which extend across any cell array which is located between other two arrays, to electrically connect the selected polycells included in these two arrays. In this case, these lines (known as "through-lines") are limited in number with respect to each cell array. If more through-lines than are allowed are used, polycells having equivalent electrical terminals but unable to perform logic functions, (known as "through-cells") must be added to the cell array. The addition of through-cells, through which the excess lines can extend, increases the length of the cell array. In consequence, the integration density of the LSI must decrease, and a larger chip substrate must then be used.

These problems associated with the known method of designing the wiring pattern for a polycell LSI are a bar to the effective designing of high-performance polycell LSIs for performing desired logic functions.

SUMMARY OF THE INVENTION

It is therefore an object of the present invention to provide a new and improved method and apparatus for automatically designing a layout of polycells on a chip substrate, so as to achieve an effective electrical connection among the polycells, thereby to permit the manufacture of a polycell LSI of a desired logic function, without increasing the size of the chip substrate.

According to this invention, there is provided a method for automatically designing a layout of polycells on a chip substrate, thereby to permit the manufacture of a semiconductor logic LSI. In this method, design data is input which includes the data representing the desired functions of the logic LSI and the data showing the cell-connection requirements that must be satisfied in order to provide the desired functions in the logic LSI device. The polycells are first arranged on the chip substrate in the form of cell arrays. Channels for wiring lines used to connect the polycells are then provided on the chip substrate, according to the cell-connection requirements, thereby forming a polycell LSI having the desired logic function. Number N (hereinafter called the "first number") of through-lines actually extending through each cell array, is obtained. Number ml (hereinafter called the "second number") of through-lines which can be used for each cell array, is calculated, too. Third number K, or the difference of (ml−N), is also obtained. It is determined whether or not K is a negative number. If K for a certain cell array is found to be a negative number, the polycells are rearranged on the chip substrate such that K is changed to zero or to a positive number. As a result, it is no longer necessary to add through-lines to this cell array. Hence, the total length of the cell arrays need not increase, and the chip substrate need not be replaced by a larger one.

The method of this invention can be performed by a computer-controlled apparatus including an input unit for inputting the design data and a processor unit for calculating the desired positions of the through-lines, so that the polycells are automatically rearranged on the chip substrate.

The invention and its objects and advantages will become more apparent in the detailed description of a preferred embodiment, given below.

BRIEF DESCRIPTION OF THE DRAWINGS

In the detailed description of a preferred embodiment of the invention, reference is made to the accompanying drawings, in which:

FIG. 1 is a plan view of a logic LSI (not drawn to scale) comprising standard cells or polycells arranged in a conventional design scheme;

FIGS. 3A and 3B show a flow chart explaining the design process performed by the system shown in FIG. 2;

FIG. 5 is a plan view of a logic LSI (not drawn to scale) comprising polycells which have been rearranged by the system of FIG. 2.

DETAILED DESCRIPTION OF THE PREFERRED EMBODIMENT

Figure 2:
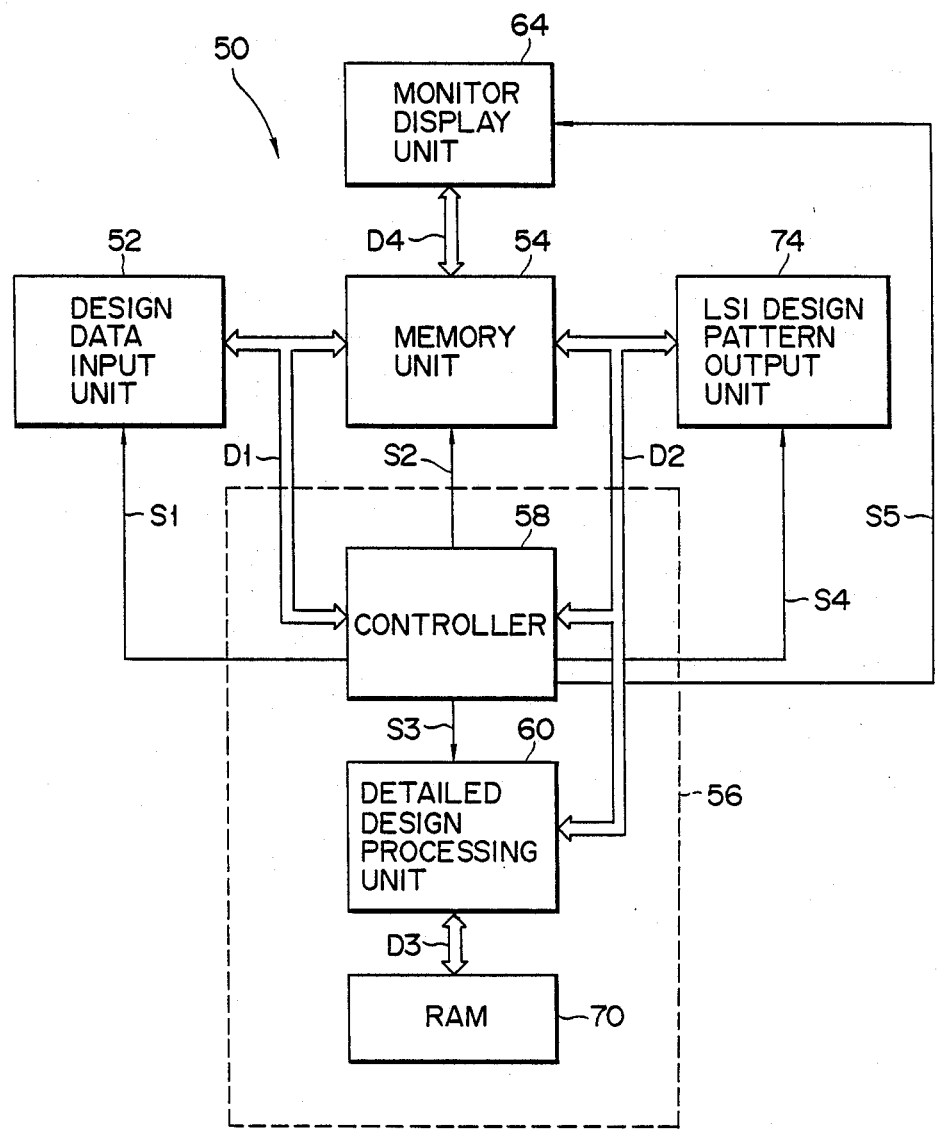
FIG. 2 is a schematical block diagram showing a computer-controlled system for automatically designing a cell-layout on a chip substrate and also a wiring pattern of a polycell LSI, in accordance with one preferred embodiment of the present invention.

FIG. 1 is a plan view showing a conventional polycell LSI having a number of polycells arranged in the form of arrays on a chip substrate 10, in accordance with the conventional cell layout scheme.

As is generally known in the art, polycells, which must be used to form a polycell LSI having the function desired by a user, correspond to logic blocks of various types, such as inverters, 3-input NAND gates, flip-flops, etc. The blocks are selected from a library, i.e., a data file in which pieces of data, used for designing polycell LSIs, are stored. The layout and electrical connection of polycells are designed in accordance with the customer's instructions. The polycell LSI of FIG. 1 comprises four arrays A1, A2, A3, and A4 formed on chip substrate 10. Array A1 consists of four polycells 12a, 12b, 12c, and 12d. Array A2 is formed of polycells 14a, 14b, 14c, and 14d. Array A3 is comprised of polycells 16a, 16b, 16c, and 16d. Array A4 consists of polycells 18a, 18b, 18c, and 18d. (Hereinafter, the polycells of the same array will be designated by numerals only, when these polycells need not be distinguished.) The polycell LSI comprises components (not shown) such as I/O buffers of known type and bonding pad patterns of known type.

The layout of the polycells on chip substrate 10 is designed to reduce the chip area to a minimum. To this end, polycells 12, 14, 16, and 18 are arranged to form four arrays A1 to A4 and to satisfy the following three requirements:

1. The estimated total length of the lines for connecting the polycells should be minimized.
2. The number of lines crossing the cut lines (boundary line defined on the chip substrate) of the chip should be minimized.
3. The density of lines (i.e., the number of lines extending across a wiring region, for a "channel") should be minimized.

More specifically, the polycells are arranged in the form of arrays, first by constructive placement and then by iterative placement improvement, to satisfy requirements 1, 2, and 3.

During the global and detailed routing of the polycell arrays (FIG. 1), stacked metal wiring lines are used. For example, first metal lines are used, extending parallel to the arrays, and second metal lines are stacked on the first lines, and extend at right angles to the arrays. The second lines may also be used as wiring lines extending through a cell array, for electrical connection among polycells. Wiring lines formed of polycrystalline silicon film and the first metal lines (and, if necessary, the second metal liens) are used to connect the elements provided within each polycell.

In the polycell LSI, i is usual to provide "wiring-prohibited regions" for each layer of the wiring lines. Specific regions, where wiring lines for connecting elements in polycells are formed to obtain a desired cell function, may be used as the "wiring-prohibited regions." Since these wiring-prohibited regions have first priority in the wiring pattern design process, even if the second line need to extend through a polycell array, the second lines must be prohibited from passing across the "wiring-prohibited regions" of the cell array. In this case, the second lines should be arranged to pass across the cell arrays in other regions, i.e., "wiring-permitted regions", which are designated by "20a", "20b", "20c", and "20d" in FIG. 1. (The second wiring lines can be designed to extend around the polycell array, thereby not crossing the cell array. If such is the case, however, requirement 1 (i.e., total wire length should be minimized) cannot be satisfied.

Wiring regions 20, provided in each cell array, are limited in number. Hence, they cannot always allow the passage of all the wiring lines required to connect the polycells of one array to those of another, thereby to provide a polycell LSI having the function desired by the user. The more complex the logic function of the LSI, the fewer the wiring regions each array can have. In order to allow the passage of the excess wiring lines in this case, so-called "through-cells" are added to each array. Through-cells are dummy cells having no logic functions.

For instance, two wiring lines 22a and 22b need to pass across array A2 (FIG. 1). However, array A2 has no wiring regions 20. Hence, two through-cells 24a and 24b are provided between polycells 14b and 14c, and wiring lines 22a and 22b pass through cells 24a and 24b, thus crossing-array A2. Because of through-cells 24a and 24b being provided, requirement 1 can be satisfied.

Since array A2 includes through-cells 24a and 24b, it is longer than the other arrays A1, A3, and A4. Hence, the polycell LSI has cell arrays of different lengths. Chip substrate 10 must therefore be large enough to accommodate the longest cell array, i.e., cell array A2. Chip substrate 10 could be smaller if array A2 were the same length as arrays A1, A3, and A4. Generally, the larger the chip substrate, the lower the integration density of the polycell LSI, and the higher the manufacturing cost of the LSI. Although this aspect is a serious problem to LSI manufactures, nevertheless, no serious attempts have been made to thoroughly resolve this problem.

The problem can be resolved by means of the automatic, polycell-layout designing technique of the present invention, which will be described hereinafter.

Referring to FIG. 2, the system (50) of this invention, for automatically designing a cell-layout, will now be described. System 50 includes design data input unit 52. Items of initial design data are input to unit 52. These items of data include: data representing the types of polycells 12, 14, 16, and 18 to be arranged on chip substrate 10, to form a polycell LSI having the function desired by the user; data specifying the wiring-prohibited regions and wiring-permitted regions of each of the arrays; data requesting that the required specific polycells be connected (hereinafter called "connection-request data"); and data showing an object function required when arranging and connecting the polycells to form a polycell LSI having the desired function. The object function includes the following conditions: the minimum estimated total net length of the lines for connecting the cells; the least number of lines crossing the cut lines of substrate 10; and the lowest possible density of lines in the wiring regions of each array. All initial design data is supplied from data input unit 52 to memory unit 54 and is temporarily stored therein, under the control of central processing unit 56.

Central processing unit 56 includes controller 58 and detailed design processing unit 60. Controller 58 is linked by control signal lines S1 to S5, to the main units, including design data input unit 52 and, memory unit 54. Data can be transferred among these units, via data bus lines D1 to D4. Processing unit 60 is programmed to perform various operations to accomplish detailed design, such as the constructive placement of polycells and the provisional connection of polycells. In other words, unit 60 automatically calculates the best possible layout of polycells (and optimum connection thereof) which both satisfy not only the user's polycell LSI specification but also the object function. This calculation process will later be described.

Figure 3B:
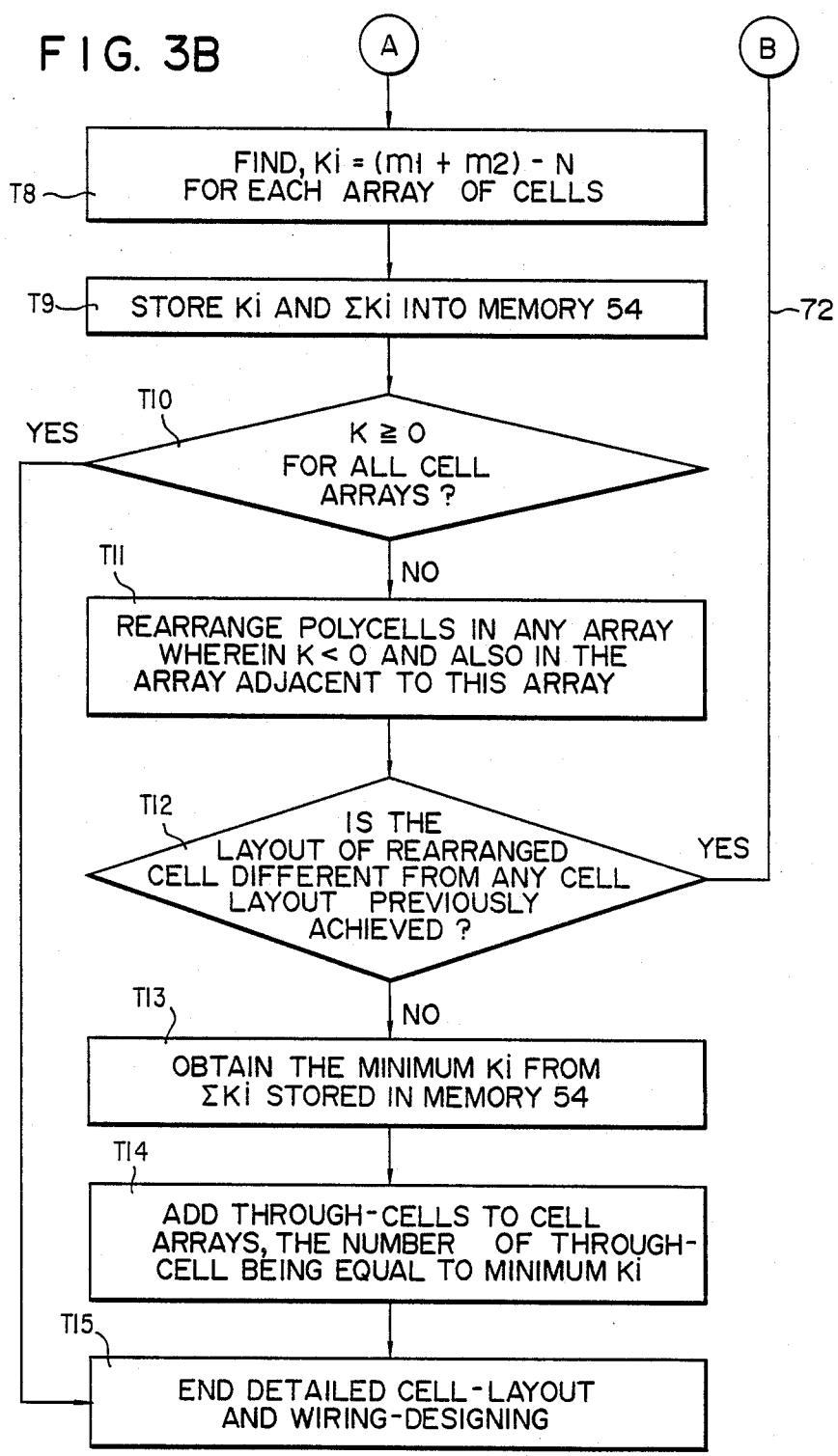
Figure 4A:
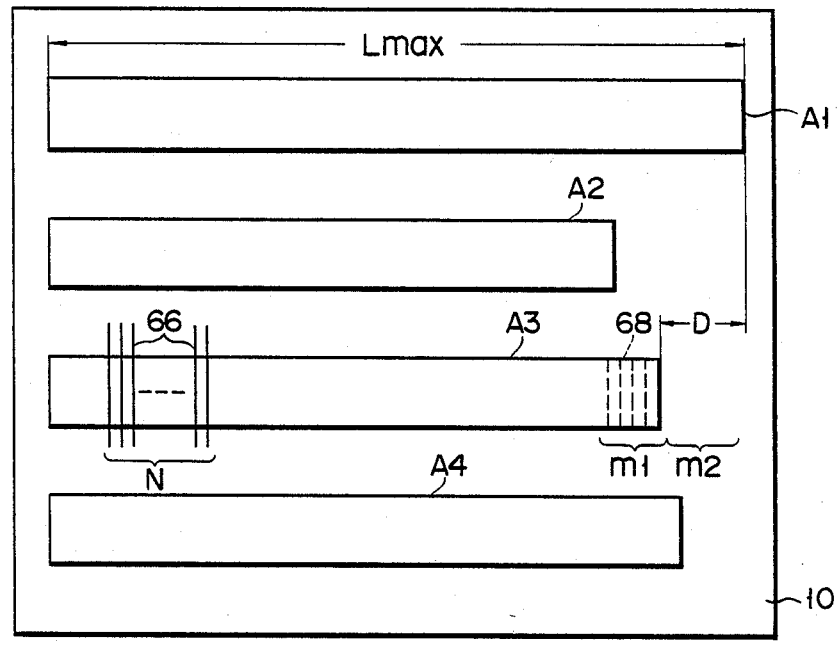
FIG. 4A is a plan view of a polycell LSI comprising cell arrays formed on a chip substrate.

FIGS. 3A and 3B are flow charts explaining the operation of the system shown in FIG. 2. First, the data relating to all polycells to be arranged on chip substrate 10 is read from memory unit 54 under the control of controller 58 (T1). This data is supplied to processing unit 60 vis data bus D2. The specified object function is also read from memory unit 54 and supplied to processing unit 60 via data bus D2. Unit 60 determines the initial cell-layout which can satisfy the input object function (T2). The process of determining the initial cell-layout can be the same as the conventional one. The initial cell-layout thus determined is shown in FIG. 4A.

Subsequently, processing unit 60 performs the wiring simulation design in such a manner as to determine wiring line paths among the polycells, which are initially arranged in cell arrays A (four cell arrays A1 to A4 are illustrated in FIG. 4) on chip substrate 10, in accordance with the wiring connection requirement for defining the polycell LSI of the desired logic specification (T3). There is thus obtained a provisional electrical connection pattern of wiring lines for the initially arranged polycells. The design results of the wiring connection pattern may be displayed on monitor display unit 64 under the control of controller 58, if it is so required by the operator.

Processing unit 60 then starts designing the best possible cell-layout/cell-connection pattern, which is the main feature of the present invention. More specifically, unit 60 calculates estimated number N of through-lines which will extend across each cell-array A (FIG. 4A) of the initial cell-layout, to which the provisional wiring connection pattern is added as described above (T4). It also obtains number m1 of through-lines which can cross each cell array A (T5). In the case of array (A3), for example, shown in FIG. 4A, of throughline crossing cell array A3 are designated by numeral "66". Throughlines which can cross this cell array A3 are designated by numeral "68", the number of which is denoted m1. In this case, m1 is 4. The reference "m2" denotes the number of through-lines which can cross through a side-channel area corresponding to the difference D in length between this cell array A3 and the longest array A1.

Processing unit 60 calculates the lengths (L) of cell arrays A1 to A4 (FIG. 4A), thereby obtaining maximum array length Lmax, i.e., the length of longest cell array A1 (T6). Then, unit 60 calculates differences D between Lmax, on the one hand, and the lengths of shorter cell arrays A2 to A4, on the other. Differences D represent the lengths of the regions of chip substrate 10, which can be used as side-channels for wiring lines. In other words, unit 60 calculates the number m2 of wiring lines which can extend through the side-channel area of each of cell arrays A2 to A (T7).

After calculating the numbers m1 and m2 for every cell array A, processing unit 60 calculates the following value, K, for each cell array A:

$$K_i = (m1 + m2) - N \qquad (1)$$

where "i" is the number of the individual cell array (i=1, 2, 3, or 4) (T8).

Unit 60 calculates the sum of the Ki's, i.e., $\Sigma K_i$ (T9). In the model of FIG. 4A, $\Sigma K_i$ is given as follows:

$$\Sigma K_i = K1 + K2 + K3 + K4 \qquad (2)$$

Values K1 to K4 and value $\Sigma K_i$ are stored in random-access memory (RAM) 70 provided in CPU 56 under the control of controller 58, in the form of a data table.

Thereafter, processing unit 60 determines whether or not Ki is more than zero (T10), that is, it perform the following operation:

$$K_i > 0 \qquad (3)$$

If K1, K2, K3, and K4 are found to satisfy formula (3), system 50 (FIG. 2) ends the process of designing the detailed cell-layout and of the wiring connection pattern of the polycells (T15). Since the actual number of array-crossing wiring lines (through-lines) is less than the allowable line number (i.e., m1+m2) with respect to each cell array, this means that all the polycells of arrays A1 to A4 can be connected with one another to satisfy the wiring connection requirements, without the use of any through-cells.

Figure 4B:
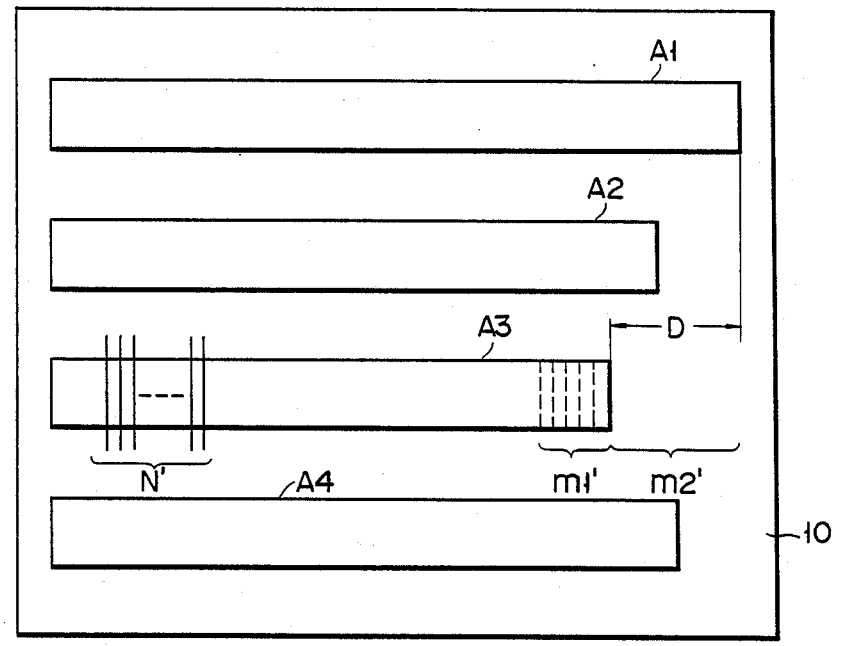
FIG. 4B is a plan view of another polycell LSI comprising polycells rearranged by the system of FIG. 2, to reduce the number of required through-cells.

If the Ki of at least one of cell arrays A formed on chip substrate 10 is defected as not satisfying the above condition defined by formula (3), processing unit 60 designs a detailed cell-layout in such a manner that polycells are partially rearranged on chip substrate 10 while keeping the number of cell arrays not satisfying the object function to a minimum (T11). More specifically, value (m1+m2) for a certain cell array, wherein Ki<0, is increased, and/or polycells are exchanged between this array (A) and the adjacent arrays, thereby decreasing N for this array. FIG. 4B illustrates the improved arrangement of cell arrays A in the model of FIG. 4A, which is obtained after the partial exchange of polycells included in one cell array A3, where K3<0. The reference symbols "N'", "m1'", and "m2'" used in this example shown in FIG. 4b, denote the estimated number of through-lines crossing this cell array, the number of through-lines which can cross the cell array, and the number of through-lines which can extend through the space provided because of the difference in length between this array and the longest array, respectively. According to this example, to cause the value K3 of cell array A3 to satisfy formula (3), the polycells are exchanged between neighbouring arrays A2 and A3, whereby the allowable crossing line number m1 of cell array A3 can be increased from "4", shown in FIG. 4A, to "5", in FIG. 4B, and, further, the side-channel area of array A3 can be expanded to increase the allowable passing line number m2 for array A3.

Processing unit 60 then determines whether or not the cell-layout achieved by rearranging the polycells is different from the previous cell-layout (T12). If YES, the operation of system 50 goes along flow line 72 in FIGS. 3A and 3B, and the steps of calculating Ki and Ki are repeated. Ki and ΣKi both obtained through the repetition of these steps are stored in RAM 70 provided in CPU56, in the form of a data table. The sequence of these steps are repeated until Ki for every cell array A formed on chip substrate 10 fully satisfies formula (3). When value Ki for every array A is found to satisfy formula (3), unit 60 inputs the data representing the final cell-layout/cell-connection pattern, wherein Ki is greater than zero, to memory unit 54. This data, i.e., the redesigned cell-layout/cell-connection pattern of the polycell LSI, is read from memory unit 54 and output, by output unit 74, in a known manner, whenever necessary.

It can happen that value Ki for every cell array A cannot satisfy formula (3), regardless of how many times the steps of calculating Ki and ΣKi are repeated. If such is the case, processing unit 60 searches the data table stored in RAM 70, thereby identifying the cell-layout wherein the value ΣKi is the least (T13). Unit 60 then instructs that through-cells, of a number represented by the least ΣKi, be added to cell arrays A (T14). System 50 thus ends the process of designing the detailed cell-layout and of forming the wiring connection pattern of the polycells (T15). Hence, the size of chip substrate 10 can remain at a minimum also in this particular case.

FIG. 5 shows the final cell-layout/cell-connection pattern automatically designed by system 50 (FIG. 2). As comparison of this final design with the cell-layout/cell-connection pattern of the conventional polycell LSI (FIG. 1) will reveal, polycell 14c has been moved from array A2 into array A3, and polycell 16c has been moved from array A3 to array A2. In other words, one polycell has been exchanged between arrays A2 and A3. Owing to this cell-exchange, two wiring regions 20c and 20d have been added to array A2, that is, number m1 for array A2 has been increased by two. Therefore, the polycell LSI designed by system 50 does not require two through-cells 24a and 24b, which have, of necessity, been added to array A2 of the conventional polycell LSI shown in FIG. 1.

In the system described above, i.e., one embodiment of the present invention, processing unit 60 can design the detailed layout and connection pattern of the polycells on chip substrate 10, thereby designing a polycell LSI requiring the minimum number of necessary through-cells. More specifically, when more through-lines than allowed need to extend across any of the cell arrays formed on substrate 10, unit 60 determines the number of excess through-lines according to the above equation (1), and redesigns the initial cell-layout so that the least possible number of through-cells is provided for the excess through-lines. Thus, the size of chip substrate 10 can be reduced to a minimum.

Although the invention has been described with reference to a specific embodiment, it shall be understood by those skilled in the art that numerous modifications can be made that are within the spirit and scope of the inventive contribution.

What is claimed is:

1. A computer-controlled apparatus for automatically designing a cell-layout of a semiconductor logic LSI device having standard cells, on a ship substrate, said apparatus comprising:
   (a) input means for receiving design data including an object function and cell-wiring requirements defining a desired logic function of said LSI device; and
   (b) processor means connected to said input means, for arranging said standard cells in cell arrays, and for designing electrical connection of said standard cells in accordance with said cell-wiring requirements, so as to maximally satisfy said object function, thereby obtaining an LSI logic circuit, said processor means comprising:
   first means for calculating a first number "N" of wiring lines which actually extend through each array of standard cells initially arranged on said chip substrate,
   second means for calculating a second number "m1" of wiring lines that are allowed to extend through each array of standard cells initially arranged on said chip substrate,
   third means for calculating a third number "K" representing a difference "m1−N" between said first and second numbers of each cell array, and for determining whether or not said cell arrays include a certain cell array where said third number "K" is less than zero, and
   fourth means for rearranging said standard cells on said chip substrate, when it is found that said certain cell array is included in said cell array, such that said third number "K" of said certain cell array is increased to zero or to more than zero, thereby minimizing lengths of the cell arrays and ultimately minimizing a size of said chip substrate, said fourth means stopping the designing execution if said third number "K" is zero or more than zero, and for causing the above calculating process executed by said first to third means to be repeated if said third number "K" remains negative after the rearrangement is executed, and adding to said certain cell array a corresponding number of through-cells when said number "K" still remains negative even after rearrangement is executed repeatedly 2. The apparatus according to claim 1, wherein said processor means further comprises:
   fifth means for calculating a length "L" of each of said cell arrays, to specify a cell array having the maximum length, and for calculating differences "D" between said maximum length and the lengths of the remaining cell arrays; and
   sixth means for calculating a fourth number "m2" of wiring lines which can extend on that surface area of said chip substrate which corresponds to the calculated length difference "D" of each of said remaining cell arrays.

3. The apparatus according claim 2, wherein said third means performs an operation defined by the following equation, to calculate said third number "K" for each cell array:

$$K=(m1+m2)-N.$$

4. A method for automatically designing a cell-layout of a semiconductor logic LSI device having standard cells, on a chip substrate, said method comprising the steps of:

(a) inputting design data including an object function and cell-wiring requirements defining a desired logic function of said LSI device;

(b) arranging said standard cells in cell arrays, on said chip substrate; and (c) determining electrical connection paths for wiring lines among said standard cells, in accordance with said cell-wiring requirements, so as to maximally satisfy said object function, thereby obtaining an LSI logic circuit, said connection paths-determining step comprising, calculating a first number "N" of wiring lines which actually extend through each array of standard cells initially arranged on said chip substrate, calculating a second number "m1" of wiring lines that are allowed to extend through each array of standard cells initially arranged on said chip substrate, calculating a third number "K" representing a difference "m1−N" between said first and second numbers of each cell array, to determine whether or not said cell arrays include a certain cell array where said third number "K" is less than zero, and rearranging said standard cells on said chip substrate, when it is found that said certain cell array is included in said cell array, such that said third number "K" of said certain cell array is increased to zero or to more than zero, thereby minimizing lengths of the cell arrays and ultimately minimizing a size of said chip substrate and stopping the designing execution if said third number "K" is zero or more than zero, and for causing the above calculating process executed by said first to third means to be repeated if said third number "K" remains negative after the rearrangement is executed.

5. The method according to claim 4, wherein said connection paths-determining step further comprises:

calculating a length "L" of each of said cell arrays, to specify a cell array having the maximum length, calculating differences "D" between said maximum length and the lengths of the remaining cell arrays; and calculating a fourth number "m2" of wiring lines which can extend on that surface area of said chip substrate which corresponds to the calculated length difference "D" of each of said remaining cell arrays.

6. The method according to claim 5, wherein an operation defined by the following equation is performed to calculate said third number "K" for each cell array:

$$K=(m1+m2)-N.$$

* * * * *